(12) United States Patent
Cho et al.

(10) Patent No.: US 7,737,485 B2
(45) Date of Patent: *Jun. 15, 2010

(54) NON-VOLATILE MEMORY CELLS INCLUDING FIN STRUCTURES

(75) Inventors: Eun-Suk Cho, Gyeonggi-do (KR); Choong-Ho Lee, Gyeonggi-do (KR); Tae-Yong Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/193,200

(22) Filed: Aug. 18, 2008

(65) Prior Publication Data

US 2008/0303079 A1    Dec. 11, 2008

Related U.S. Application Data

(62) Division of application No. 10/975,643, filed on Oct. 28, 2004, now Pat. No. 7,473,611.

(30) Foreign Application Priority Data

May 31, 2004    (KR) ................................. 2004-39024

(51) Int. Cl.
*H01L 29/94* (2006.01)
(52) U.S. Cl. ............................ 257/316; 257/E29.264; 257/314; 257/315
(58) Field of Classification Search .......... 257/E29.264, 257/314–316
See application file for complete search history.

(56) References Cited

U.S. PATENT DOCUMENTS

| 5,751,037 A | 5/1998 | Aozasa |
| 5,869,369 A | 2/1999 | Hong |
| 5,874,760 A | 2/1999 | Burns et al. |
| 5,969,384 A | 10/1999 | Hong |
| 6,168,985 B1 * | 1/2001 | Asano et al. ................ 438/241 |
| 6,440,801 B1 | 8/2002 | Furukawa et al. |

(Continued)

FOREIGN PATENT DOCUMENTS

JP        09-0977851        4/1997

(Continued)

OTHER PUBLICATIONS

Notice to File a Response/Amendment to the Examination Report from Korean Intellectual Property Office for Application No. 1020040039024.

*Primary Examiner*—N Drew Richards
*Assistant Examiner*—Yu-Hsi Sun
(74) *Attorney, Agent, or Firm*—Myers Bigel Sibley & Sajovec, P.A.

(57) ABSTRACT

A method of forming a non-volatile memory device may include forming a fin protruding from a substrate, forming a tunnel insulating layer on portions of the fin, and forming a floating gate on the tunnel insulting layer so that the tunnel insulating layer is between the floating gate and the fin. A dielectric layer may be formed on the floating gate so that the floating gate is between the dielectric layer and the fin, and a control gate electrode may be formed on the dielectric layer so that the dielectric layer is between the control gate and the fin. Related devices are also discussed.

20 Claims, 14 Drawing Sheets

U.S. PATENT DOCUMENTS

| | | | |
|---|---|---|---|
| 6,468,862 B1 | 10/2002 | Tseng | |
| 6,617,639 B1 | 9/2003 | Wang et al. | |
| 6,693,321 B1 * | 2/2004 | Zheng et al. | 257/314 |
| 6,753,216 B2 * | 6/2004 | Mathew et al. | 438/199 |
| 6,790,782 B1 | 9/2004 | Yang et al. | |
| 6,878,985 B2 | 4/2005 | Arai et al. | |
| 7,005,700 B2 | 2/2006 | Lee | |
| 7,042,770 B2 | 5/2006 | Lee et al. | |
| 7,072,214 B2 | 7/2006 | Jeong et al. | |
| 7,087,950 B2 | 8/2006 | Willer et al. | |
| 7,138,680 B2 | 11/2006 | Li et al. | |
| 7,154,779 B2 | 12/2006 | Mokhlesi et al. | |
| 7,164,168 B2 | 1/2007 | Forber et al. | |
| 2002/0093073 A1 | 7/2002 | Mori et al. | |
| 2003/0042531 A1 * | 3/2003 | Lee et al. | 257/315 |
| 2003/0116795 A1 | 6/2003 | Joo | |
| 2003/0151077 A1 | 8/2003 | Mathew et al. | |
| 2003/0178670 A1 | 9/2003 | Fried et al. | |
| 2005/0035415 A1 * | 2/2005 | Yeo et al. | 257/401 |
| 2005/0157549 A1 | 7/2005 | Mikhlesi et al. | |
| 2005/0227435 A1 | 10/2005 | Oh et al. | |
| 2005/0266638 A1 | 12/2005 | Cho et al. | |
| 2005/0272192 A1 | 12/2005 | Oh et al. | |

FOREIGN PATENT DOCUMENTS

| | | |
|---|---|---|
| JP | 2002-016154 | 1/2002 |
| JP | 2006-041489 | 2/2006 |
| KR | 10-0199369 | 3/1999 |
| KR | 1020010003086 | 1/2001 |
| KR | 1020030008990 | 1/2003 |
| KR | 1020030053318 | 6/2003 |
| KR | 1020060111184 | 10/2006 |

* cited by examiner

NON-VOLATILE MEMORY CELLS INCLUDING FIN STRUCTURES

RELATED APPLICATION

This application claims the benefit of priority as a divisional of U.S. application Ser. No. 10/975,643 filed Oct. 28, 2004 now U.S. Pat. No. 7,473,611, which claims the benefit of and priority under 35 U.S.C. Sec. 119 to Korean Patent Application No. 2004-39024, filed on May 31, 2004. The disclosures of both of the above referenced applications are hereby incorporated herein by reference in their entirety.

FIELD OF THE INVENTION

This disclosure generally relates to electronic memory devices and, more particularly, to non-volatile memory devices and methods.

BACKGROUND OF THE INVENTION

In general, non-volatile memory devices are capable of storing data, even with power turned off. Non-volatile memory devices may be provided using flash memory cells with stacked gate structures. A flash memory cell with a stacked gate structure may provide non-volatile memory characteristics and allow data to be written and/or erased electrically. In addition, a flash memory cell with a stacked gate structure may allow a high degree of integration with a sequential stacked structure of a floating gate and a control gate electrode. As a result of these characteristics, a flash memory device using flash memory cells having the stacked gate structure have been adopted for use as storage media for portable electronic products and/or next generation storage media. A flash memory cell with a stacked gate structure will be discussed with reference to FIG. 1.

FIG. 1 is a cross-sectional view illustrating a conventional flash memory cell having a stacked gate structure. Referring to FIG. 1, a device isolation layer (not shown) may be provided on a predetermined region(s) of a semiconductor substrate 1 to define an active region(s). A control gate electrode 5 crosses over the active region. A floating gate 3 is provided between the control gate electrode 5 and the active region. A tunnel oxide layer 2 is provided between the floating gate 3 and the active region. The tunnel oxide layer 2 may be formed from a thermal oxide layer. A gate interlayer oxide layer 4 may be provided between the floating gate 3 and the control gate electrode 5. The gate interlayer oxide layer 4 may be formed from a silicon oxide layer deposited using chemical vapor deposition (CVD). Source/drain regions 6 may be provided in the active region on opposite sides of the control gate electrode 5.

The floating gate 3 is electrically isolated, and data stored in the flash memory cell may be either a "logic 1" or "logic 0" according to an electrical charge of the floating gate 3.

With a relatively high-integration of memory devices, a turn-on current of the flash memory cell may be reduced as the width of a channel region under the floating gate 3 is reduced. Accordingly, a sensing margin of the flash memory cell may be reduced, To maintain an acceptable sensing margin, an operation voltage may be increased. In addition, overlapped areas between the floating gate 3 and the control gate 5 may be reduced, and a coupling ratio of the flash memory cell may thus be reduced. For these reasons, smaller flash memory cells may require higher operating voltages, and power dissipation may thus be increased. Moreover, an interface between the tunnel oxide layer 2 and the active region may be damaged by higher operating voltages, and reliability of the flash memory cell may be reduced.

SUMMARY

According to embodiments of the present invention, a method of forming a non-volatile memory device may include forming a fin protruding from a substrate, forming a tunnel insulating layer on portions of the fin, and forming a floating gate on the tunnel insulting layer so that the tunnel insulating layer is between the floating gate and the fin. A dielectric layer may be formed on the floating gate so that the floating gate is between the dielectric layer and the fin, and a control gate electrode may be formed on the dielectric layer so that the dielectric layer is between the control gate and the fin.

More particularly, the dielectric layer may include a high-K dielectric material (such as hafnium oxide, aluminum oxide, and/or lanthanum oxide) having a dielectric constant higher than a dielectric constant of silicon nitride. Moreover, the fin may have a mesa shape with a mesa surface opposite the substrate and mesa sidewalls between the mesa surface and the substrate. A transition from the mesa surface to a mesa sidewall may have a rounded shape.

The control gate electrode may include a conductive metal nitride layer in contact with the dielectric layer, and the conductive metal nitride layer may include at least one of titanium nitride, tantalum nitride, and/or tantalum nitride. The control gate electrode may also include a metal layer on the conductive metal nitride layer so that the conductive metal nitride layer is between the metal layer and the dielectric layer. Moreover, the metal layer may include at least one of a tungsten layer and/or a molybdenum layer. In addition, portions of the fin may extend beyond opposite sides of the control gate electrode, and portions of the fin extending beyond the control gate electrode may be doped.

Forming the fin may include forming first and second fins protruding from the substrate, and the first and second fins may be parallel. Moreover, the tunneling layer may be formed on portions of the first and second fins, and the floating gate may be formed on portions of the first and second fins with the tunnel insulating layer between the floating gate and the first and second fins. In addition, the dielectric layer may be formed on the first and second fins so that the floating gate is between the dielectric layer and the first and second fins, and the control gate electrode may cross the first and second fins with the dielectric layer between the control gate electrode and the first and second fins.

According to additional embodiments of the present invention, a non-volatile memory device may include a fin protruding from a substrate, a tunnel insulating layer on portions of the fin, and a floating gate on the tunnel insulting layer so that the tunnel insulating layer is between the floating gate and the fin. In addition, a dielectric layer my be provided on the floating gate so that the floating gate is between the dielectric layer and the fin, and a control gate electrode may be provided on the dielectric layer so that the dielectric layer is between the control gate and the fin.

The dielectric layer may include a high-K dielectric material (such as hafnium oxide, aluminum oxide, and/or lanthanum oxide) having a dielectric constant higher than a dielectric constant of silicon nitride. More particularly, the dielectric layer may include an aluminum oxide layer and at least one of a hafnium oxide layer and/or a lanthanum oxide layer. Moreover, the fin may have a mesa shape with a mesa surface opposite the substrate and mesa sidewalls between the mesa surface and the substrate, and a transition from the mesa surface to a mesa sidewall may have a rounded shape.

In addition, the control gate electrode may include a conductive metal nitride layer in contact with the dielectric layer, and the conductive metal nitride may include at least one of titanium nitride, tantalum nitride, and/or tantalum nitride. The control gate electrode may also include a metal layer on the conductive metal nitride layer wherein the conductive metal nitride layer is between the metal layer and the dielectric layer, and the metal layer may include at least one of a tungsten layer and/or a molybdenum layer. Portions of the fin may also extend beyond opposite sides of the control gate electrode, and portions of the fin extending beyond the control gate electrode may be doped.

The non-volatile memory device may also include a second fin protruding from the substrate wherein the first and second fins are parallel. Moreover, the tunnel insulating layer may be provided on portions of the first and second fins, and the floating gate may be provided on portions of the first and second fins with the tunnel insulating layer between the floating gate and the first and second fins. In addition, the dielectric layer may be provided on the first and second fins with the floating gate between the dielectric layer and the first and second fins, and the control gate electrode may cross the first and second fins with the dielectric layer between the control gate electrode and the first and second fins.

According to some embodiments of the present invention, a turn-on current of a non-volatile memory cell may be increased while reducing an operating voltage thereof, and/or integration densities of non-volatile memory cells may be increased.

According to embodiments of the present invention, a non-volatile memory cell may include a fin vertically protruding from a substrate, a control gate electrode crossing over the fin, and a floating gate provided between the control gate electrode and the fin. A tunnel insulating layer may be provided between the floating gate and the fin. A high-k dielectric layer may be provided between the control gate electrode and the floating gate. The high-k dielectric layer may have dielectric constant higher than that of a silicon nitride layer.

More particularly, the high-k dielectric layer may be formed of one or more selected from hafnium oxide, aluminum oxide, and/or lanthanum oxide, and/or a combination thereof. In particular the high-k dielectric layer may be formed of a first layer including aluminum oxide, and a second layer including at least one of hafnium oxide and/or lanthanum oxide. An upper edge of the fin may have a rounded shape. The non-volatile memory cell may further include an insulating layer placed on the substrate to surround a lower portion of the fin, and a portion of the gate electrode located at both sides of the fin may be placed on the insulating layer. At least a lower portion of the control gate electrode in contact with high-k dielectric layer may be formed of a conductive metal nitride material. The cell may further include an impurity doped layer formed in the fin at both sides of the control gate electrode.

According to other embodiments of the present invention, a non-volatile memory cell may include a couple of parallel fins vertically protruding from a substrate, a control gate electrode crossing over the couple of fins, and a floating gate provided between the couple of fins and the control gate electrode. A tunnel insulating layer may be provided between the floating gate and the couple of fins. A high-k dielectric layer having a dielectric constant higher than that of a silicon nitride layer may be provided between the control gate electrode and the floating gate. An impurity doped layer may be formed in the fins at both sides of the control gate electrode.

More particularly, the non-volatile memory cell may further include a connection part for connecting edge portions of the couple of fins. The connection part may protrude from the substrate, and the top surface of the connection part may have a same height as that of the fins. In this case, the impurity doped layer may also be formed in the connection part. The floating gate may be conformally placed along both sidewalls and a top surface of the couple of fins and along a bottom of a gap region between the couple of fins located under the floating gate. The control gate electrode may extend downward to fill in the gap region, intervening the high-k dielectric layer.

According to still other embodiments of the present invention, methods of forming a non-volatile memory cell may include forming a fin vertically protruding from a substrate; forming a tunnel insulating layer on a surface of the fin; forming a preliminary floating gate covering and parallel with the fin; forming a high-k dielectric layer (having a dielectric constant higher than that of a silicon nitride layer) and a gate material layer on the substrate in the order named; and successively patterning the gate material layer, the high-k dielectric layer and the preliminary floating gate to form floating gate, high-k dielectric pattern and a control gate electrode which are sequentially stacked. Moreover, the control gate electrode may cross over the fin.

More particularly the high-k dielectric layer may be formed from at least one of hafnium oxide, aluminum oxide, and/or lanthanum oxide, and/or a combination(s) thereof. In particular, the high-k dielectric layer may be formed of a first layer including aluminum oxide, and a second layer including at least one of hafnium oxide and/or lanthanum oxide. An upper edge of the fin may be formed to have a rounded shape using a bird's beak of a thermal oxide layer. Before forming the tunnel insulating layer, an insulating layer may be formed to surround a lower portion of the fin. At least a lower portion of the control gate electrode in contact with the high-k dielectric layer may be formed of a conductive metal nitride material. The method may also include forming an impurity doped layer in the fin at both sides of the gate control electrode.

According to yet other embodiments of the present invention, methods of forming a non-volatile memory cell may include: forming a couple of fins vertically protruding from a substrate parallel with each other; forming a tunnel insulating layer on a surface of the fins; forming a preliminary floating gate covering the couple of fins parallel with the fins; forming a high-k dielectric layer (having dielectric constant higher than that of a silicon nitride layer) and a gate material layer on the substrate in the order named; successively patterning the gate material layer, the high-k dielectric layer and the preliminary floating gate to form a floating gate, a high-k dielectric pattern and a control gate electrode, which are sequentially stacked; and forming an impurity doped layer in the fins at both sides of the control gate electrode.

More particularly, forming the couple of fins may include: forming a preliminary fin and a hard mask pattern (which are sequentially stacked on a substrate), wherein the preliminary fin protrudes vertically from the substrate; isotropic etching the hard mask pattern to expose an edge of the top surface of the preliminary fin; forming a filling insulating layer covering a sidewall of the etched hard mask pattern, a sidewall of the preliminary fin and the exposed edge of the top surface of the preliminary fin; selectively removing the etched hard mask pattern to expose a portion of the top surface of the preliminary fin; anisotropic etching the exposed preliminary fin to the couple of fins; and recessing the filling insulating layer. In addition, a connection part may be formed for connecting edge portions of the couple of fins. The top surface of the connection part may have a same height as that of the fins, and the impurity doped layer may also be formed in the connection part. At this time, the impurity doped layer may also be formed in the connection part. The floating gate may be conformally formed along both sidewalls and top surfaces of the couple of fins and a bottom of gap region between the couple of fins located under the floating gate. At this time, the control gate electrode may extend downward to fill in the gap region, intervening the high-k dielectric layer.

BRIEF DESCRIPTION OF THE DRAWINGS

FIGS. 4A to 7A are cross-sectional views illustrating steps of forming a non-volatile memory cell taken along section line I-I' of FIG. 2 according to embodiments of the present invention.

FIGS. 4B to 7B are cross-sectional views illustrating steps of forming a non-volatile memory cell taken along section line II-II' of FIG. 2 according to embodiments of the present invention.

FIGS. 11A to 15A are plan views illustrating steps of forming a non-volatile memory cell according to embodiments of the present invention.

FIGS. 11B to 15B are cross-sectional views taken along section line IV-IV' of FIGS. 11A to 15A, respectively.

DETAILED DESCRIPTION

Figure 1:
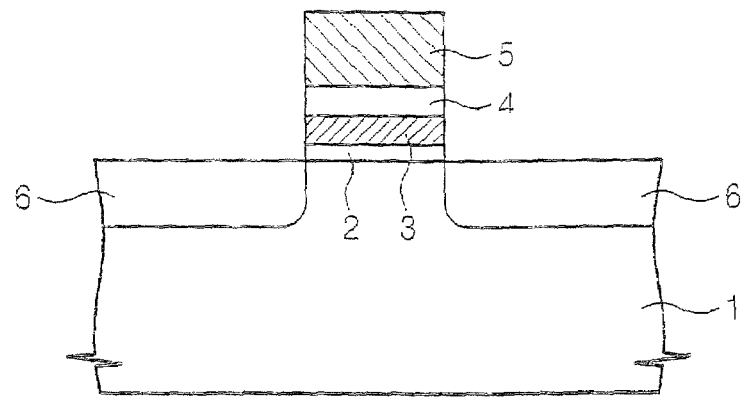
FIG. 1 is a cross-sectional view illustrating a conventional flash memory cell with a stacked gate structure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, lower, upper, top, and bottom, may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore encompass both an orientation of above and below. Similarly, the term lower can encompass both an orientation of lower and upper; the term upper can encompass both an orientation of upper and lower; the term top can encompass both an orientation of top and bottom; and the term bottom can encompass both an orientation of bottom and top.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
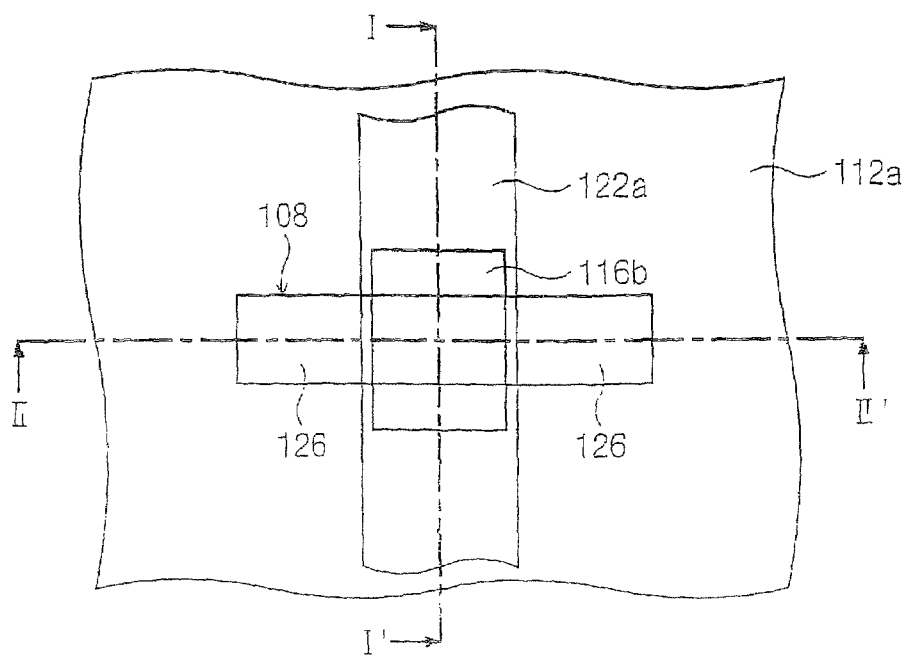
FIG. 2 is a plan view illustrating a non-volatile memory cell according to embodiments of the present invention.
Figure 3A:
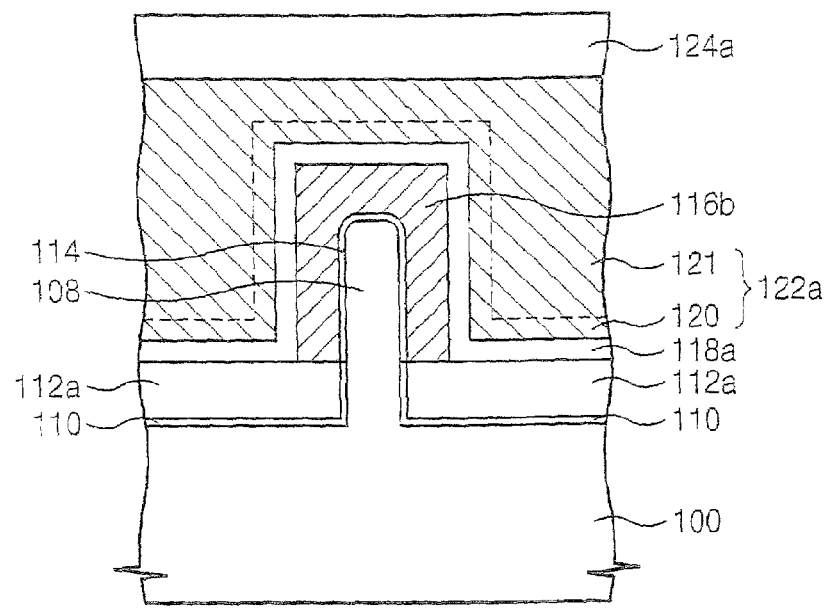
FIG. 3A is a cross-sectional view taken along section line I-I' of FIG. 2.

FIG. 2 is a plan view illustrating a non-volatile memory cell according to embodiments of the present invention. FIG. 3A is a cross-sectional view taken along section line I-I' of FIG. 2, and FIG. 3B is a cross-sectional view taken along section line II-II' of FIG. 2.

Figure 3B:
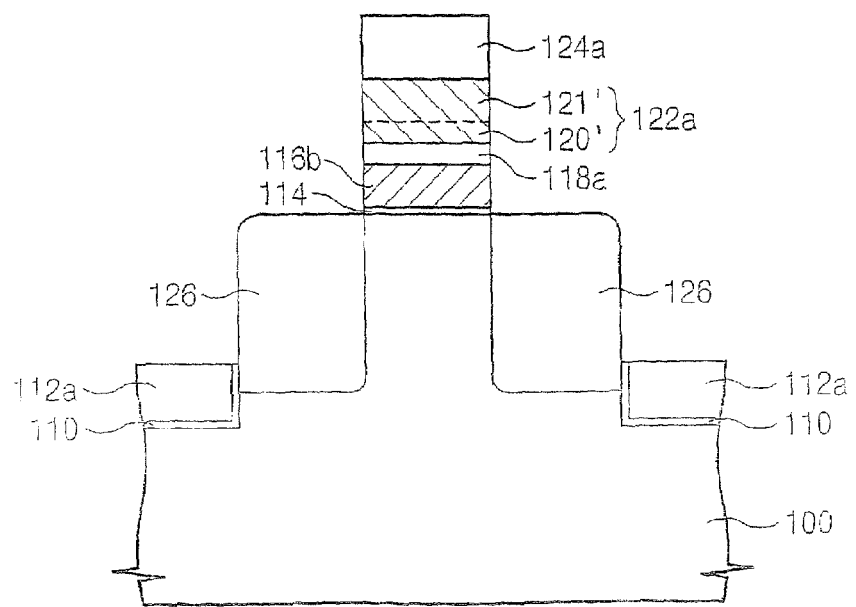
FIG. 3B is a cross-sectional view taken along section line II-II' of FIG. 2.

Referring to FIGS. 2, 3A and 3B, a fin 108 may protrude from a semiconductor substrate 100 (hereinafter inclusively referred to as a substrate"). The fin 108 may be patterned from the substrate 100. Accordingly the fin 108 and the substrate 100 may be formed of a same material such as a single crystalline silicon.

A filling insulating pattern 112a on the substrate 100 may surround lower sidewalls of the fin 108. Accordingly, an upper portion of the fin 108 may protrude beyond the filling insulating pattern 112a. The filling insulating pattern 112a may correspond to a device isolating layer. The filling insulating pattern 112a may be formed from a high-density plasma silicon oxide layer or a spin-on-glass (SOG) layer (which may provide an excellent gap-fill characteristic). A sidewall oxide layer 110 may be provided between the filling insulating pattern 112a and the substrate 100, and between the filling insulating pattern 112a and lower sidewalls of the fin 108. The sidewall oxide layer 110 may be formed using thermal oxidation.

A control gate electrode 122a may cross over the fin 108. A portion of the control gate electrode 122a located at both sides of the fin 108 may be provided on the filling insulating pattern 112a. A floating gate 116b may be provided between the control gate electrode 122a and the fin 108. The floating gate 116b may cover both sidewalls and a top surface of the fin 108 under the control gate electrode 122a. The floating gate 116b may have sidewalls aligned with sidewalls of the control gate electrode 122a, and the floating gate 116b may be electrically isolated. A capping pattern 124a having sidewalls aligned with sidewalls of the control gate electrode 122a may be provided on the control gate electrode 122a. The control gate electrode 122a is formed of a conductive material(s). The floating gate 116b may be formed from doped polysilicon, and/or the floating gate 116b may be formed from a trap insulating layer having deep level traps (such as a silicon nitride layer). The capping pattern 124a may be formed from a silicon nitride layer and/or a silicon oxide layer.

A tunnel insulating layer 114 may be provided between the floating gate 116b and the fin 108. The tunnel insulating layer 114 may be formed from silicon oxide. In particular, the tunnel insulating layer 114 may be formed using thermal oxidation. A high-k dielectric pattern 118a may be provided between the control gate electrode 122a and the floating gate 116b. The floating gate 116b is electrically isolated from the fin 108 and the control gate electrode 122a by the tunnel insulating layer 114 and the high-k dielectric layer 118a, respectively. Additionally, the floating gate 116b is electrically isolated from the substrate 100 by the filling insulating pattern 112a or/and the sidewall oxide layer 110. Also, the floating gate 116b is electrically isolated from a floating gate (not shown) of another neighboring cell. Impurity doped layers 126 are provided in the fin 108 at both sides of the control gate electrode 122a. The impurity doped layers 126 of the fin 108 may provide source/drain regions. A channel region of the above-mentioned non-volatile memory cell may be provided along portions of a top surface and both sidewalls of the fin 108 covered with the floating gate 116b.

The high-k dielectric pattern 118a may be formed from an insulating material having dielectric constant higher than that of silicon nitride. The high-k dielectric layer 118a may be formed from metal oxide. More particularly, the high-k dielectric layer 118a may be formed from one of hafnium oxide, aluminum oxide, and/or lanthanum oxide, and/or a combination(s) thereof. For example, the high-k dielectric layer 118a may include first layer of aluminum oxide, and a second layer of at least one of hafnium oxide and/or lanthanum oxide. The aluminum oxide layer may have a relatively high crystallization temperature (approximately 1000° C.) so that leakage current passing by a crystal face can be reduced in a high-k dielectric layer 118a including an aluminum oxide layer. In addition, subsequent steps (which are performed after forming the high-k dielectric pattern 118a) may have increased margins with respect to process temperature. Moreover, because a hafnium oxide layer (having a dielectric constant of approximately 25) may have a higher dielectric constant than an aluminum oxide layer (having a dielectric constant of approximately 10), a high-k dielectric layer 118a including an aluminum oxide layer and a hafnium oxide layer may have reduced leakage currents and a relatively high dielectric constant.

Moreover, a lower portion 120' of the control gate electrode 122a in contact with the high-k dielectric pattern 118a may be formed of a conductive metal nitride material. For example, the lower portion 120' of the control gate electrode 122a may include a titanium nitride layer and/or a tantalum nitride layer. In addition or in an alternative, the control gate electrode 122a may be formed of another conductive metal nitride material such as tungsten nitride. An upper portion 121' of the control gate electrode 122a may be formed from the same conductive metal nitride material as the lower portion 120'. In an alternative, the upper portion 121' of the control gate electrode 122a may be formed from a metal such as tungsten or molybdenum.

When doped polysilicon is formed using an $SiH_4$ source gas on high-k dielectric pattern 118a formed from a metal oxide, the $SiH_4$ gas may capture oxygen in the metal oxide layer. As a result, characteristics of the high-k dielectric pattern 118a may degrade. It may be possible to reduce the above mentioned characteristic degradation of the high-k dielectric pattern 118a by forming the lower portion 120' of the control gate electrode 122a with a conductive metal nitride material that is relatively chemically stable.

Moreover, upper edges of the fin 108 may have a rounded shape. Accordingly, electric field concentration on the upper edge of the fin 108 may be reduced, and leakage currents resulting from a hump phenomenon may be reduced.

A channel region of the memory cell may thus have a 3-dimensional structure including portions of both sidewalls and a top surface of the fin 108 covered with the floating gate 116b. Accordingly, a width of the channel region may be increased without increasing a surface area of the substrate occupied by the memory cells so that a turn-on current of the non-volatile memory cell may be increased. As a result, a sensing margin of the non-volatile memory cell may be increased, and an operating voltage may be reduced.

In addition, the high-k dielectric pattern 118a may be provided between the control gate electrode 122a and the floating gate 116b. Accordingly, capacitance between the control gate electrode 122a and the floating gate 116b may be increased, and a coupling ratio of the non-volatile memory cell may be increased. It may thus be possible to further decrease an operating voltage of the non-volatile memory cell.

Furthermore, the control gate electrode 122a may cover both sidewalls and a top surface of the channel region, so that the controllability of the control gate electrode 122a with respect to the channel region may be improved. Accordingly, it may be possible to efficiently suppress short channel effects which tend to increase with increased integration densities.

By increasing a width of the channel region, a capacitance between the floating gate 116b and the channel region may be increased, and a coupling ratio of the non-volatile memory cell may be a little reduced. An increment of the coupling ratio by the high-k dielectric pattern 118a, however, may compensate for reduction of the coupling ratio by increasing a capacitance between the floating gate 116b and the channel region. In addition, an increase of the coupling ratio by the high-k dielectric pattern 118a may increase a total coupling ratio of the non-volatile memory cell.

With the floating gate 116b having a 3-dimensional structure including the fin 108, the control gate electrode 122a covers a top surface and external sidewalls of the floating gate 116b. Therefore, the overlapped areas between the floating gate 116b and the control gate electrode 122a may be increased so that the coupling ratio of the non-volatile memory cell may be further increased.

A non-volatile memory device with low power consumption may thus be provided while reducing an operating voltage of the non-volatile memory cell. In addition, a turn-on current may be increased without increasing a surface area of a substrate occupied by the memory cell thereby improving performance in relatively highly integrated non-volatile memory devices.

FIGS. 4A to 7A are cross-sectional views illustrating steps of forming a non-volatile memory cells according to embodiments of the present invention, taken along section line I-I' of FIG. 2. FIGS. 4B to 7B are cross-sectional views illustrating steps of forming the non-volatile memory cell according to embodiments of the present invention, taken along section line II-II' of FIG. 2.

Figure 4A:
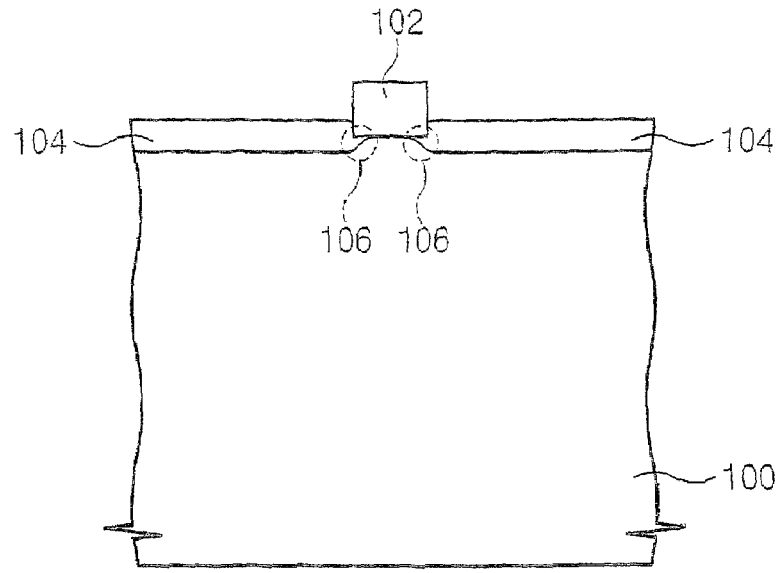
Figure 4B:
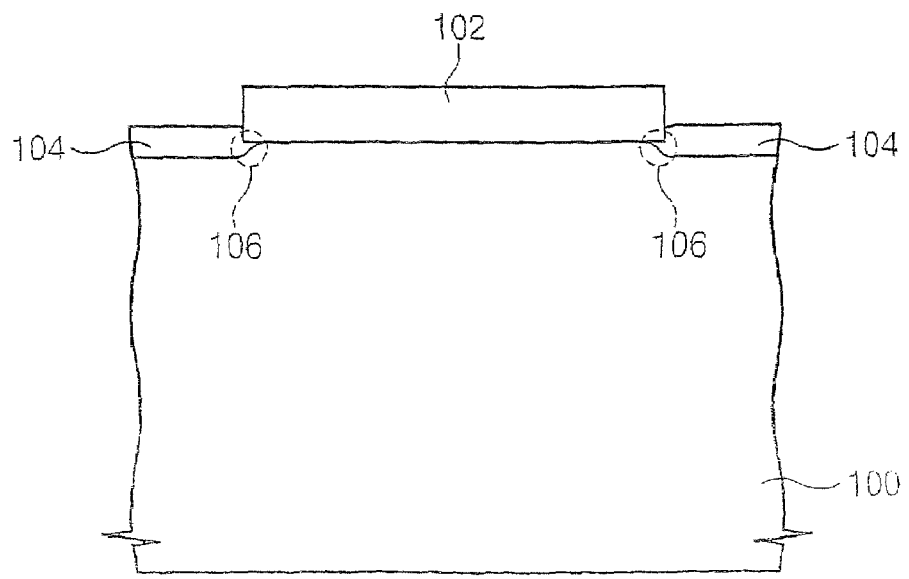

Referring to FIGS. 4A and 4B, a hard mask pattern 102 is formed on predetermined regions of a substrate 100. The hard mask pattern 102 is formed of a material having an etch selectivity with respect to the substrate 100. In addition, the hard mask pattern 102 may be formed of a material capable of reducing thermal oxidation. For example, the hard mask pattern 102 may include a silicon nitride layer. More particularly, the hard mask pattern 102 may be formed of a buffer oxide layer and a silicon nitride layer, with the buffer oxide layer between the silicon nitride layer and the substrate 100.

A thermal oxide layer 104 may be formed by performing a thermal oxidation on the substrate 100 having the hard mask pattern 102 thereon. A bird's beak 106 may be formed at edges of the thermal oxide layer 104 and/or under edges of the hard mask pattern 102.

Figure 5A:
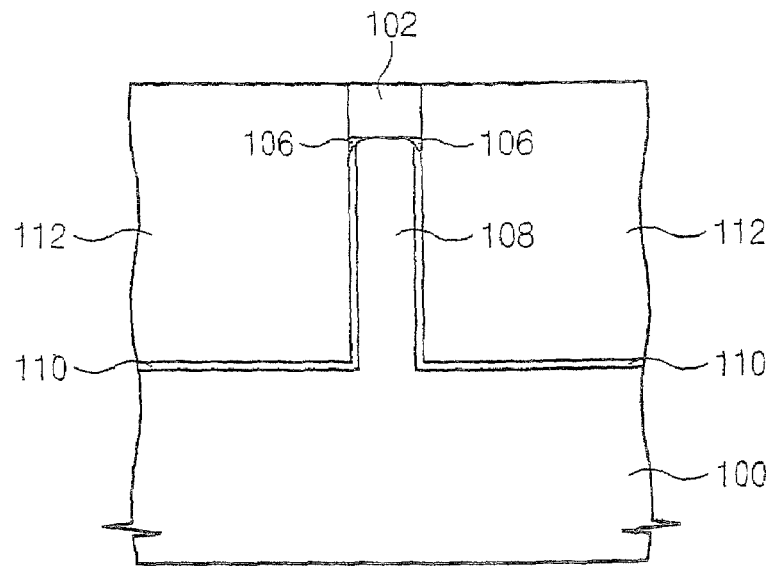
Figure 5B:
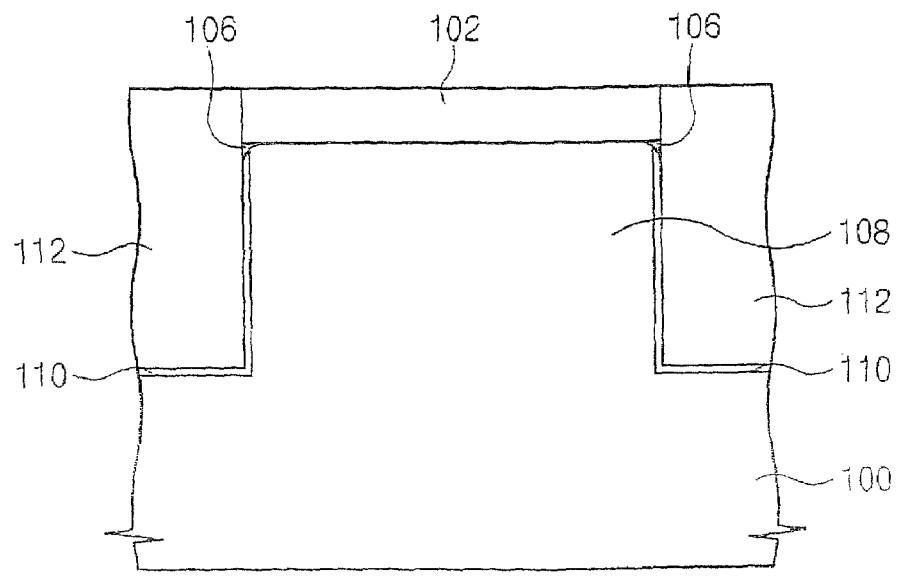

Referring to FIGS. 5A and 5B, the thermal oxide layer 104 and the substrate 100 may be successively etched using the hard mask pattern 102 as an etching mask to form a fin 108, protruding approximately 90 degrees relative to the substrate 100. At this time, an upper edge of the fin 108 may have a rounded shape due to the bird's beak 106.

A sidewall oxide layer 110 may be formed by performing a thermal oxidation process on the substrate 100 and fin 108. While forming the sidewall oxide layer 110, etching damage of sidewalls of the fin 108 and a surface of the substrate 100 around the fin 108 may be reduced and/or cured.

A filling insulating layer may be formed on an entire surface of the substrate 100 including the sidewall oxide layer 110 to fill the etched region of the substrate 100. Then, the filling insulating layer may be planarized until the hard mask pattern 102 is exposed. The planarized filling insulating layer 112 may cover sidewalls of the hard mask pattern 102 and the fin 108. The planarized filling insulating layer 112 may be formed of an insulating material having excellent gap-fill characteristic, such as a high-density plasma silicon oxide and/or a spin-on-glass (SOG).

Figure 6A:
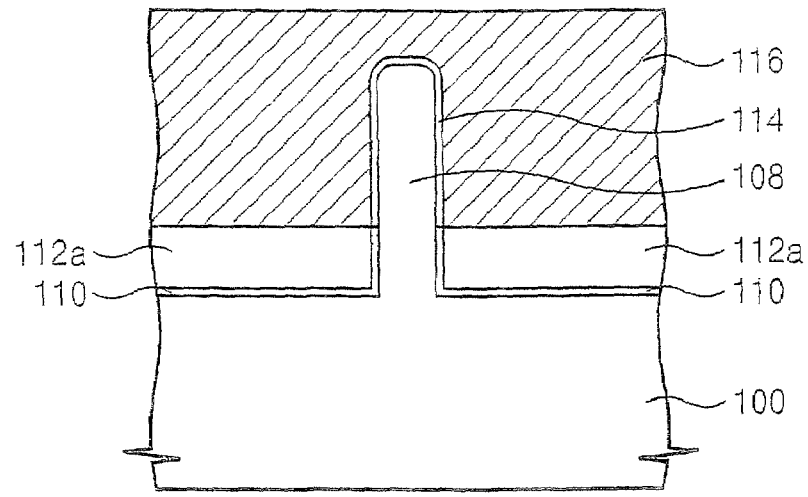
Figure 6B:
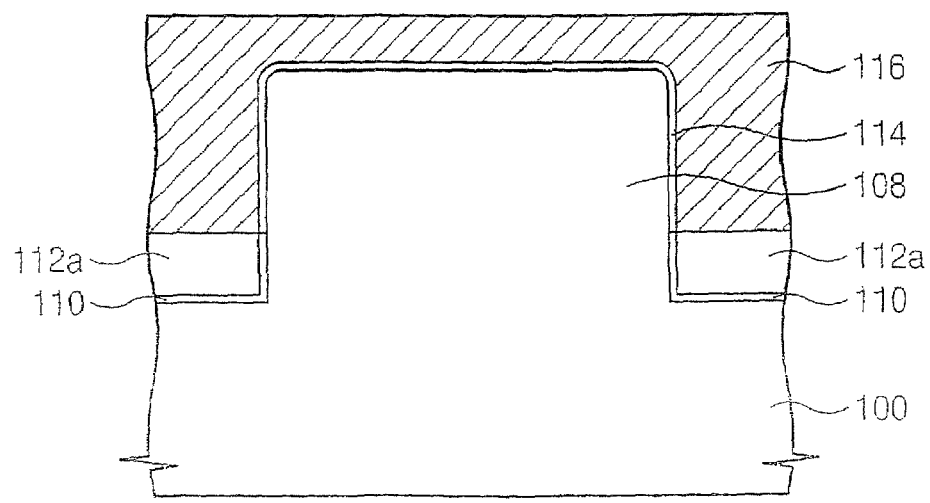

Referring to FIGS. 6A and 6B, an upper portion of the fin 108 may be exposed. One method for exposing the upper portion of the fin 108 is described hereinafter. In advance, the planarized filling insulating layer 112 may be recessed to form a filling insulating pattern 112a surrounding a lower portions of the sidewalls of the fin 108. At this time, the sidewall oxide layer 110 formed on upper portions of the sidewalls of the fin 108 may be exposed. The hard mask pattern 102 may then be removed to expose a top surface of the fin 108 and the bird's beak 106. The exposed bird's beak 106 and the exposed portions of sidewall oxide layer 110 may then be removed to expose upper portions of the fin 108. If the hard mask pattern 102 includes a buffer oxide layer, the bird's beak 106 may be removed with the buffer oxide layer. The sidewall oxide layer 110 formed on upper portions of sidewalls of the fin 108 may be removed while recessing the planarized filling insulating layer 112.

According to other methods, after the hard mask pattern 102 is removed to expose upper surface portions of the fin 102 and the bird's beak 106, the planarized filling insulating layer 112 may be recessed to form the filling insulating pattern 112a. Portions of the sidewall oxide layer 110 formed on upper portions of sidewalls of the fin 108 and the bird's beak 106 may be removed to expose upper portions of the fin 108.

In this case, recessing the planarized filling insulating layer 112, removing portions of the sidewall oxide layer 110 formed on upper portions of sidewalls of the fin 108, and removing the bird's beak 106 may be performed at the same time.

A tunnel insulating layer 114 may be formed on a surface of the exposed upper portion of the fin 108. The tunnel insulating layer 114 may be formed using thermal oxidation. A first gate material layer 116 may be formed on an entire surface of a substrate 100 including the tunnel insulating layer 114. A top surface of the first gate material layer 116 may be planarized. The first gate material layer 116 may be formed of a doped polysilicon layer. In addition or in an alternative, the first gate material layer 116 may be formed of a trap insulating layer having deep level traps, such as a silicon nitride layer.

Figure 7A:
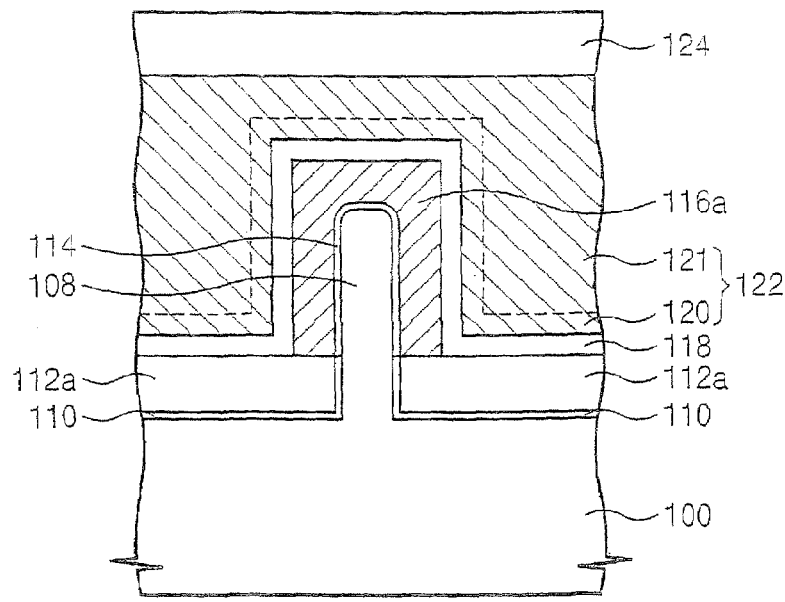
Figure 7B:
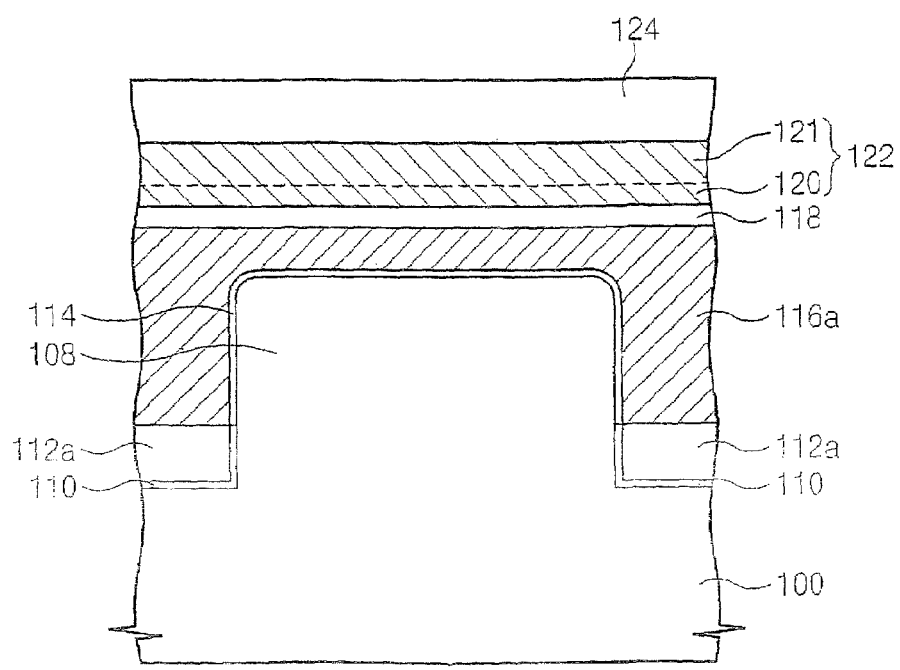

Referring to FIGS. 7A and 7B, the first gate material layer 116 may be patterned to form a preliminary floating gate 116a. The preliminary floating gate 116a may be parallel with respect to the fin 108 and may cover the fin 108. In other words, the preliminary floating gate 116a may cover a top surface and sidewalls of the fin 108.

A high-k dielectric layer 118 may be formed on an entire surface of the substrate 100 including the preliminary floating gate 116a. The high-k dielectric layer 118 may be formed of an insulating material having a dielectric constant higher than that of silicon nitride. The high-k dielectric layer 118 may be a metal oxide layer. More particularly the high-k dielectric layer 118 may be formed from one or more of hafnium oxide, aluminum oxide, and/or lanthanum oxide, or a combination(s) thereof. For example, the high-k dielectric layer 118 may include a first layer of aluminum oxide, and a second layer including at least one of hafnium oxide and/or lanthanum oxide.

A second gate material layer 122 may be formed on the substrate 100 including the high-k dielectric layer 118. The second gate material layer 122 may be formed of a conductive material. At least a lower portion 120 of the second gate material 122 may be formed of a conductive metal nitride material(s). For example, the lower portion 120 of the second gate material layer 122 may be formed of titanium nitride, tantalum nitride, and/or another conductive metal nitride(s). An upper portion 121 of the second gate material layer 122 may be formed of the same conductive metal nitride material as the lower portion 120. That is, the second gate material layer 122 may be wholly formed of a conductive metal nitride. In an alternative, the upper portion 121 of the second gate material layer 122 may be formed of a metal such as tungsten and/or molybdenum. In other words, the second gate material layer 122 may include a lower conductive metal nitride layer and an upper metal layer. The upper surface of the second gate material layer 122 may be planarized.

A capping layer 124 may be formed on the second gate material layer 122. The capping layer 124 may be formed of an insulating material such as silicon nitride and/or silicon oxide.

The capping layer 124, the second gate material layer 122, the high-k dielectric layer 118 and the preliminary floating gate 116a may be successively patterned to provide the structure illustrated in FIGS. 2, 3A and 3B. The resulting structure may include a floating gate 116b, a high-k dielectric pattern 118a, a control gate electrode 122a, and a capping pattern 124a. The control gate electrode 122a crosses over the fin 108, and the floating gate 116b is self-aligned with respect to the control gate electrode 122a.

Figure 8:
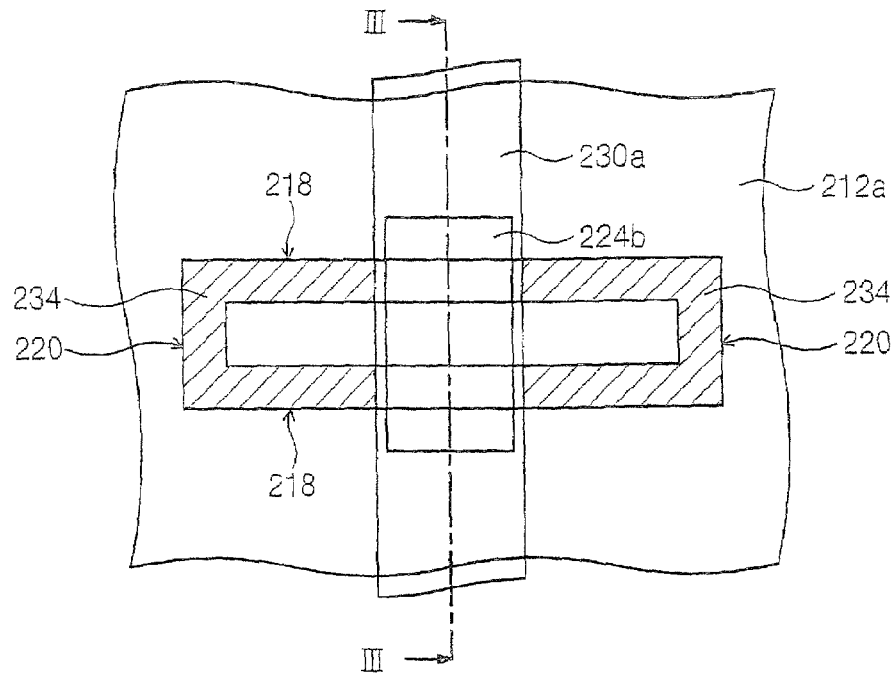
FIG. 8 is a plan view illustrating a non-volatile memory cell according to embodiments of the present invention.
Figure 9:
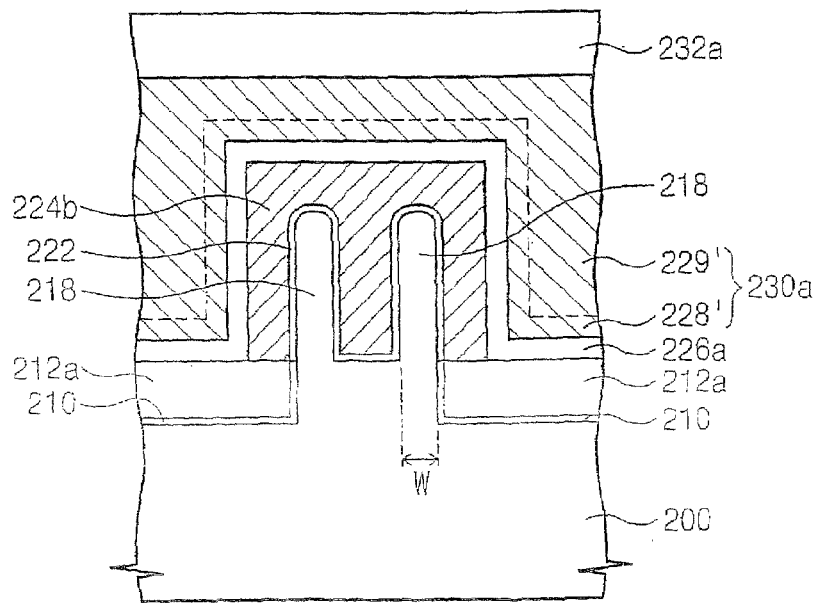
FIG. 9 is a cross-sectional view taken along section line III-III' of FIG. 8.

According to still other embodiments of the present invention illustrated in FIGS. 8 and 9, a non-volatile memory cell may be provided having an increased turn-on current, and methods of forming such a non-volatile memory cell may also be provided. FIG. 8 is a plan view illustrating a non-volatile memory cell, and FIG. 9 is a cross-sectional view taken along line III-III' of FIG. 8.

Referring to FIGS. 8 and 9, the non-volatile memory cell may include a pair of fins 218 protruding from a substrate 200 at an angle of approximately 90 degrees with respect to the substrate. The pair of fins 218 may also be parallel with respect to each other. A connection part 220 may be provided on the substrate 200 to connect edge portions of the pair of fins 218. A top surface of the connection part 220 may have a same height as that of the fins 218. The fins 218 and the connection parts 220 may be formed of a same material as the substrate 200. In other words, the substrate, the fins, and the connection parts may be formed of a same single crystal semiconductor material (such as silicon) having a same crystal orientation. A width W of each of the fins 218 may be narrower than a minimal line width that can be defined using a photolithography process.

A filling insulating pattern 212a surrounding lower sidewalls of the pair of fins 218 may be provided on the substrate 200. At this time, the filling insulating pattern 212a may cover a lower portion of external sidewalls of the pair of fins 218. That is, the filling insulating pattern 212a may be absent from a gap region between the pair of fins 218. A bottom of the gap region between the pair of fins 218 may be higher than an upper surface of the substrate 200 around the pair of fins 218. A top surface of the filling insulating pattern 212a may have a height similar to that of the bottom of the gap region. The filling insulating pattern 212a may be formed of a high-density plasma silicon oxide layer or a spin-on-glass (SOG) layer, providing gap fill characteristics.

A sidewall oxide layer 210 may be provided between the filling insulating pattern 212a and the substrate 200, and between the filling insulating pattern 212a and the fins 218. The sidewall oxide layer 210 may be an oxide layer formed using thermal oxidation.

A control gate electrode 230a may cross over the pair of fins 218. A floating gate 224b may be provided between the control gate electrode 230a and the pair of fins 218, and the floating gate 224b covers portions of both sidewalls and top surfaces of the pair of fins 218 under the control gate electrode 230a. The floating gate 224b may fill a portion of a gap region between the pair of fins 218 under the control gate electrode 230a. The floating gate 224b may have sidewalls aligned with sidewalls of the control gate electrode 230a. A capping pattern 232a may be provided on the control gate electrode 230a. The control gate electrode 230a may have sidewalls aligned with respect to sidewalls of the fins 218 and the floating gate 224b. The control gate electrode 230a may be formed of one or more conductive materials. The floating gate 224b may be formed of a doped polysilicon. In addition or in an alternative, the floating gate 224b may be formed of a trap insulating layer having deep level traps, such as a silicon nitride layer. The capping pattern 232a, for example may be formed of a silicon nitride layer and/or a silicon oxide layer.

A tunnel insulating layer 222 may be provided between the floating gate 224b and the pair of fins 218. A high-k dielectric pattern 226a may be provided between the floating gate 224b and the control gate electrode 230a. The tunnel insulating layer 222 may be a silicon oxide layer formed, for example, using thermal oxidation. An impurity doped layer 234 may be formed in the fins 218 at opposite sides of the control gate electrode 230a. A connection part 220 for connecting edge portions of the pairs of fins 218 may be provided, and the impurity doped layer 234 may be also formed in the connection part 220.

The high-k dielectric pattern 226a may be formed of an insulating material having a dielectric constant higher than that of a silicon nitride layer. For example, the high-k dielectric pattern 226a may be formed of a metal oxide. More particularly, the high-k dielectric pattern 226a may be formed of at least one selected from hafnium oxide, aluminum oxide, and/or lanthanum oxide, and/or a combination(s) thereof. More particularly, the high-k dielectric pattern 226a may include a combination of an aluminum oxide layer, and at least one of a hafnium oxide layer and/or a lanthanum oxide layer. Accordingly, leakage current through the high-k dielectric pattern 226a due to an aluminum oxide layer having a relatively high crystallization temperature can be reduced, and an increased margin may be provided with respect to a process temperature in a subsequent process. In addition, with the high-k dielectric pattern 226a including a material with a relatively high dielectric constant, a dielectric constant of the high-k dielectric pattern 226a can be increased.

At least a lower portion 228' of the control gate electrode 230a in contact with the high-k dielectric pattern 226a may be formed of a conductive metal nitride material, such as titanium nitride and/or tantalum nitride. Moreover, the lower portion 228' of the control gate electrode 230a may include an additional layer of a different conductive metal nitride, such as tungsten nitride. As a result, it may be possible to reduce characteristic degradation of the high-k dielectric layer 226a. An upper portion 229' of the control gate electrode 230a may be formed of the same conductive metal nitride material used for the lower portion 228'. That is, the control gate electrode 230a may be wholly formed of one or more conductive metal nitride materials. In an alternative, the upper portion 229' of the control gate electrode 230a may be formed of a metal such as tungsten or molybdenum.

In addition, an upper edge of the fins 218 may have a rounded shape. Accordingly, a concentration of an electric field at upper edges of the fins 218 can be reduced, and a hump phenomenon can be reduced.

In a non-volatile memory cell with the structure discussed above with respect to FIGS. 8 and 9, a channel region of the non-volatile memory cell may include both sidewalls and top surfaces of the pair of fins 218 covered with the floating gate 224b. Therefore, a width of the channel region may be further increased, and a turn-on current capacity of the non-volatile memory cell may also be further increased. As a result, a sensing margin of the non-volatile memory cell may be increased, and also an operating voltage may be reduced.

Additionally, the control gate electrode 230a and the floating gate 224b may control conductivity of both sidewalls and upper surfaces of the channel region, thereby improving a controllability of the control gate electrode 230a with respect to the channel region. Using structures discussed above, a relatively high-integration of non-volatile memory devices can be provided. Furthermore, the fin 218 may be formed narrower than a minimal line width that can be defined by a photolithography process. Accordingly, more highly-integrated non-volatile memory devices may be provided.

In addition, a coupling ratio of the cell may be reduced due to an increase of capacitance between the floating gate 224b and the channel region, but an increase of the coupling ratio by the high-k dielectric pattern 226a may compensate for this reduction. In addition, an increase of the coupling ratio by the high-k dielectric pattern 226a may increase a total coupling ratio of the non-volatile memory cell.

The floating gate 224b may thus have a 3-dimensional structure as a result of the 3-dimensional structure of the fins 218. Accordingly, overlapped areas between the floating gate 224b and the control gate electrode 230a may be increased, thereby increasing a capacitance between the floating gate 224b and the control gate electrode 230a. A coupling ratio of the cell may thus be further increased, and further reductions in operation voltages of the non-volatile memory cell may also be provided.

Figure 10:
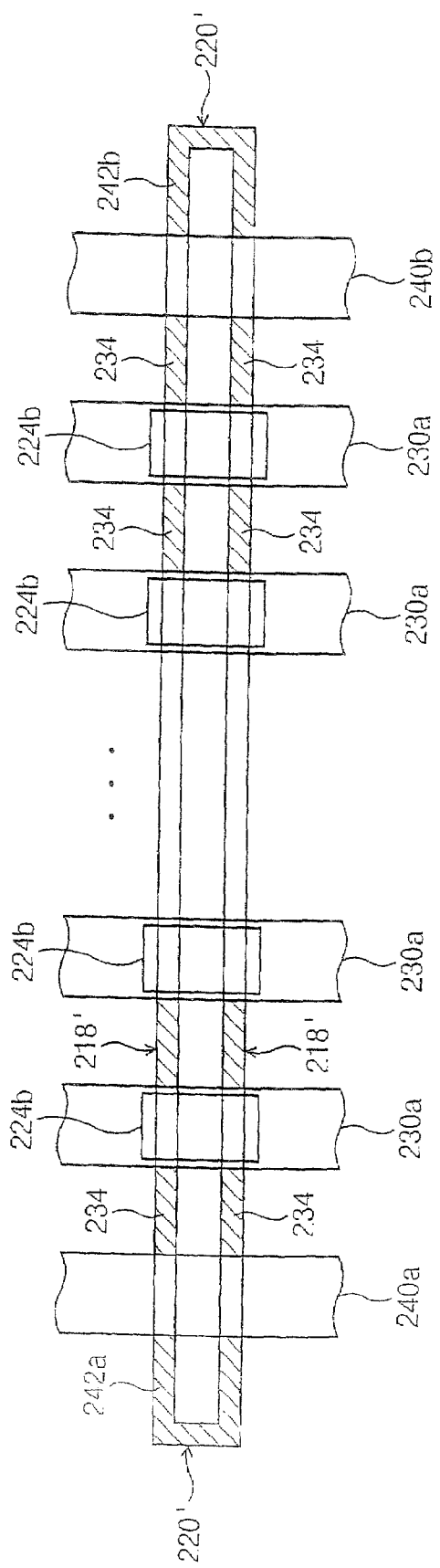
FIG. 10 is a plan view illustrating a part of a cell array using a non-volatile memory cell of FIG. 8.

Non-volatile memory cells according to embodiments of the present invention may be used in NAND-type non-volatile memory devices or a NOR-type non-volatile memory. An example of a NAND-type flash memory device is shown in FIG. 10. FIG. 10 is a plan view illustrating a portion of a cell array including a non-volatile memory cell of FIG. 8.

Referring to FIG. 10, a NAND-type non-volatile memory device may include a cell string with a plurality of non-volatile memory cells connected in a series. The NAND-type flash memory device may include a plurality of cell strings. One cell sting is illustrated in FIG. 10.

A pair of fins 218' protrude vertically from a substrate. The pair of fins 218' are placed in parallel with each other along one direction. The pair of fins 218' correspond to an active region of the cell string. A string selection gate electrode 240a and a ground selection gate electrode 240b cross over the pair of parallel fins 218'. A gate insulating layer (not shown) is provided between the string selection gate electrode 240a and the fins 218', and between the ground selection gate electrode 240b and the fins 218'.

A plurality of control gate electrodes 230a are provided in parallel between the string selection gate electrode 240a and the ground selection gate electrode 240b. The control gate electrodes are parallel with respect to each other, and the control gate electrodes are parallel with respect to the string and ground selection gate electrodes 240a and 240b. Each control gate electrode 230a crosses over the pair of fins 218'. A floating gate 224b is provided between the control gate electrode 230a and the pair of fins 218'. A high-k dielectric pattern 226a may be provided between each of the control gate electrodes 230a and floating gates 224b as shown in FIG. 9. A tunnel insulating layer 222 may be provided between each of the floating gates 224b and the pair of fins 218' as further shown in FIG. 9. The gate insulating layer and the tunnel insulating layer 222 may have a same thickness or different thickness.

First impurity doped layers 234 may be provided in the fins 218' at opposite sides of each of the control gate electrodes 230a. Stated in other words, the first impurity doped layers 234 may be provided between the control gate electrodes 230a. The first impurity doped layers 234 may correspond to source/drain regions of non-volatile memory cells. A second impurity doped layer 242a may be provided in the fins 218' located at one side of the string selection gate electrode 240a opposite the control gate electrodes 230a. A third impurity doped layer 242b may be provided in the fins 218' located at one side of the ground selection gate electrode 240b opposite the control gate electrodes 230a. The second and third impurity doped layers 242a and 242b may correspond to drain and source regions of the cell string, respectively.

A connection part 220' may be provided on the substrate to connect neighboring end portions of the pair of fins 218'. In the above-mentioned cell string, the connection parts 220' may be provided at one end of the string selection gate electrode 240a and at one end of the ground selection gate electrode 240b, respectively.

FIGS. 11A to 15A are plan views illustrating steps of forming a non-volatile memory cell according to additional embodiments of the present invention. FIGS. 11B to 15B are cross-sectional views taken along section line IV-IV' of FIGS. 11A to 15A, respectively.

Figure 11A:
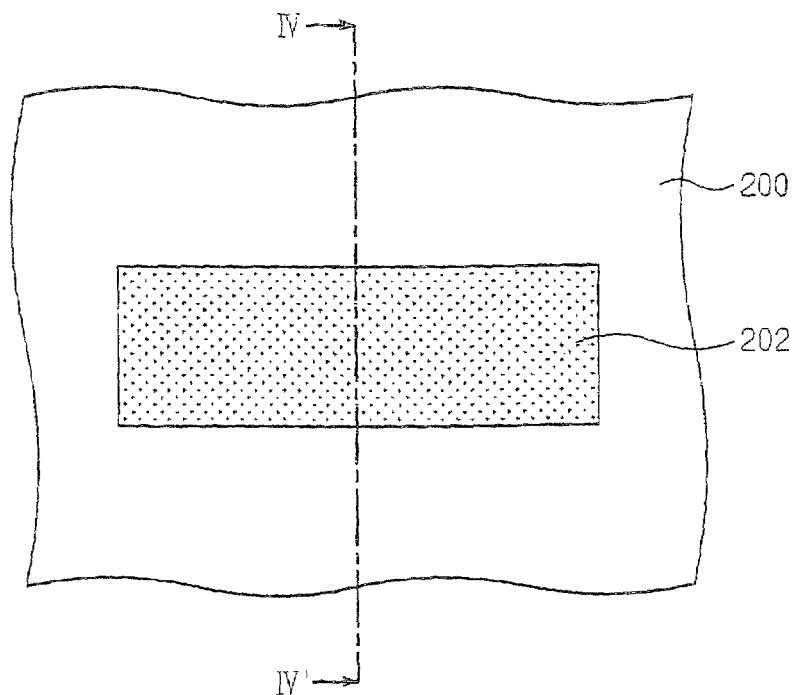
Figure 11B:
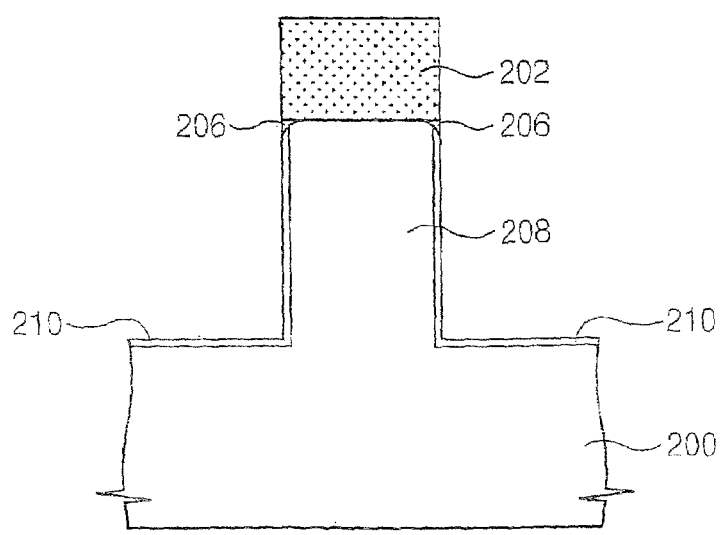

Referring to FIGS. 11A and 11B, a hard mask pattern 202 may be formed on predetermined regions of a substrate 200. A first thermal oxide layer may be formed using the hard mask pattern 202 as a mask and performing a thermal oxidation. A first bird's beak 206 may be formed at edges of the first thermal oxide layer and under edges of the hard mask pattern 202. The hard mask pattern 202 may be formed of materials having an etch selectivity with respect to the substrate 200. Moreover, the hard mask pattern 202 may be formed of a material capable of reducing thermal oxidation. For example, the hard mask pattern 202 may include a silicon nitride layer. The hard mask pattern 202 may be formed of a buffer oxide layer and a silicon nitride layer, which are sequentially stacked with the buffer oxide layer between the silicon nitride layer and the substrate. The hard mask pattern 202 may be formed using a least line width that can be defined by a photolithography process.

The first thermal oxide layer and the substrate 200 may be successively etched using the hard mask pattern 202 as an etch mask to form a preliminary fin 208 protruding from the substrate 200. An upper edge of the preliminary fin 208 may have a rounded shape as a result of the first bird's beak 206.

By performing a thermal oxidation on the substrate 200 having the preliminary fin 208, a sidewall oxide layer 210 may be formed on a sidewall of the preliminary fin 208 and a surface of the substrate 200 around the preliminary fin 208. Therefore, etching damage of the sidewall of the preliminary fin 208 and the surface of the substrate 200 may be reduced and/or cured.

Figure 12A:
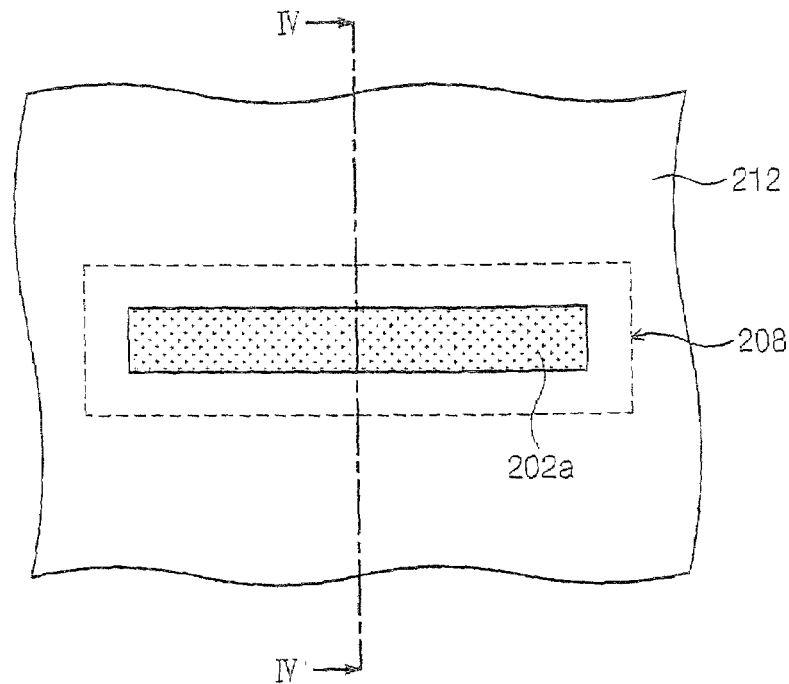
Figure 12B:
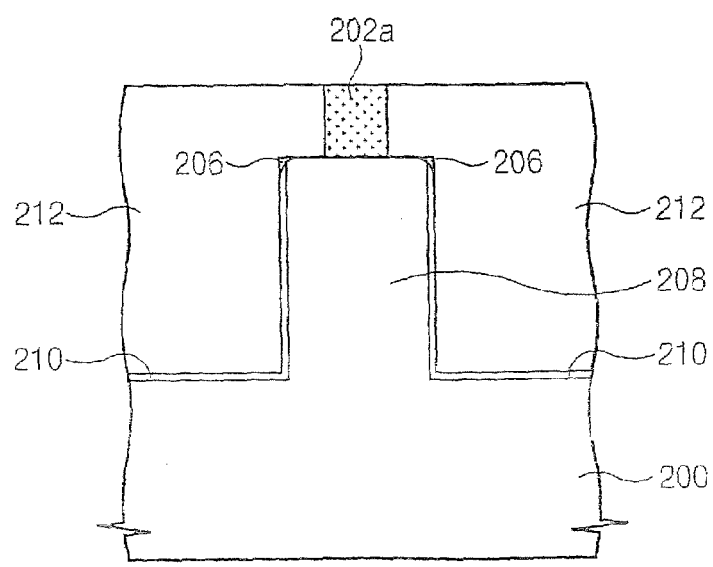

Referring to FIGS. 12A and 12B, the hard mask pattern 202 may be subjected to an isotropic etch. Accordingly, a length, width and thickness of the etched hard mask pattern 202a may be reduced, so that an edge of a top surface of the preliminary fin 208 is exposed.

A filling insulating layer may be formed on an entire surface of the substrate 200 to fill the etched region of the substrate 200. The filing insulating layer may be planarized until a top surface of the etched hard mask pattern 202a is exposed. The planarized filling insulating layer 212 surrounds sidewalls of the etched hard mask pattern 202a and the preliminary fin 208. In addition, the planarized filling insulating layer 212 may cover edges of the top surface of the preliminary fin 208.

Figure 13A:
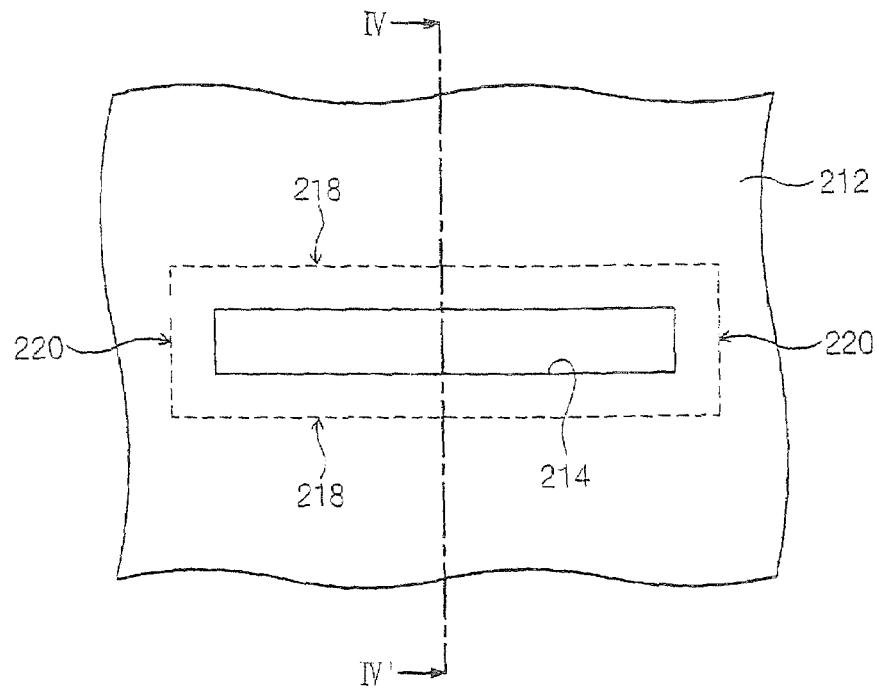
Figure 13B:
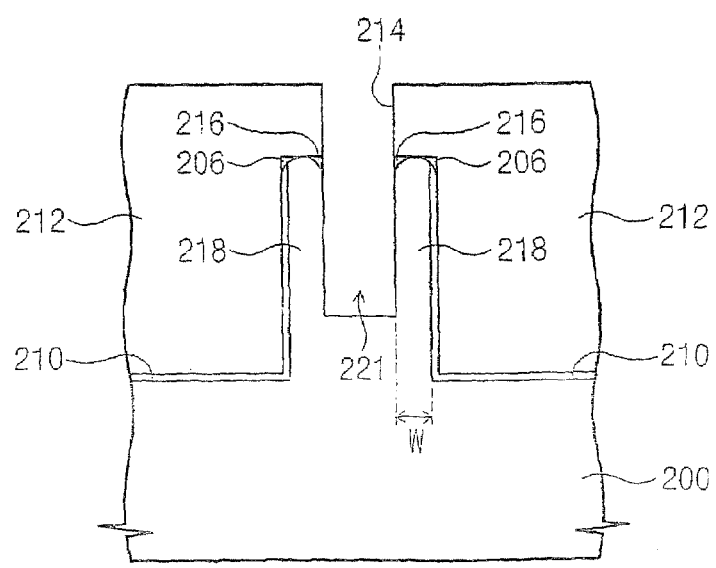

Referring to FIGS. 13A and 13B, the etched hard mask pattern 202a may be selectively removed to form a grove 214 exposing the top surface of the preliminary fin 208. Since edges of the top surface of the preliminary fin 208 are covered with the planarized filling insulating layer 212, the groove 214 exposes an uppercenter portion of the top surface of the preliminary fin 208.

A second thermal oxide layer may be formed on the top surface of the preliminary fin 208 exposed at the groove 214 using a thermal oxidation process on the substrate 200. At this time, a second bird's beak 216 may be formed at edges of the second thermal oxide layer under inner sidewalls of the groove 214.

The second thermal oxide layer and the preliminary fin 208 may be successively anisotropic etched using the planarized filling insulating layer 212 as a etch mask to form a pair of fins 218 parallel with respect to each other. At the same time, a connection part 220 connecting neighboring edge portions of the fins 218 may be formed. While etching the second thermal oxide layer, an upper portion of the planarized filling insulating layer 212 may be partially recessed. Due to the first and second bird's beaks 206 and 216, upper edges of the fin 218 may have a rounded shape.

The fin 218 may be self-aligned with respect to the groove 214. A line width W of the fin 218 may be controlled by a quantity of the hard mask pattern 202 etched using the isotropic etch discussed above with respect to FIGS. 12A-B. Accordingly, the line width W of the fin 218 may be formed narrower than the minimal line width that can be defined by a photolithography process. In particular, if the hard mask pattern 202 is formed having the minimal line width that can be defined by the photolithography process, the line width W of the fin 218 may be defined to be even narrower. As a result, a channel region formed in the fin 218 may be completely depleted more easily. In addition, a relatively high-integration density of non-volatile memory cells may be provided.

The bottom of a gap region 221 between the pair of fins 218 may be higher than a surface of a substrate 200 around the pair of fins 218.

Figure 14A:
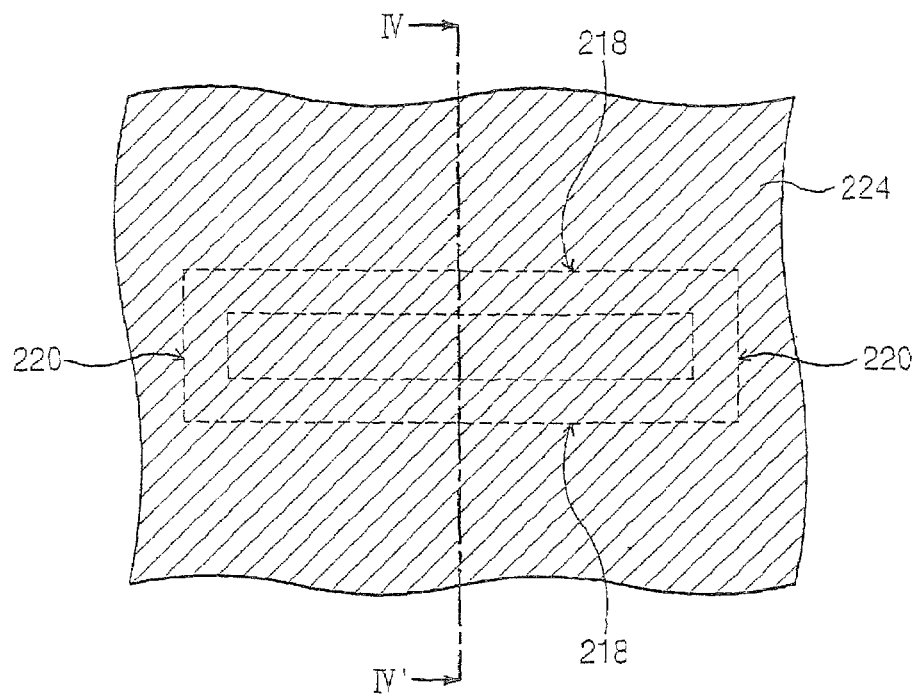
Figure 14B:
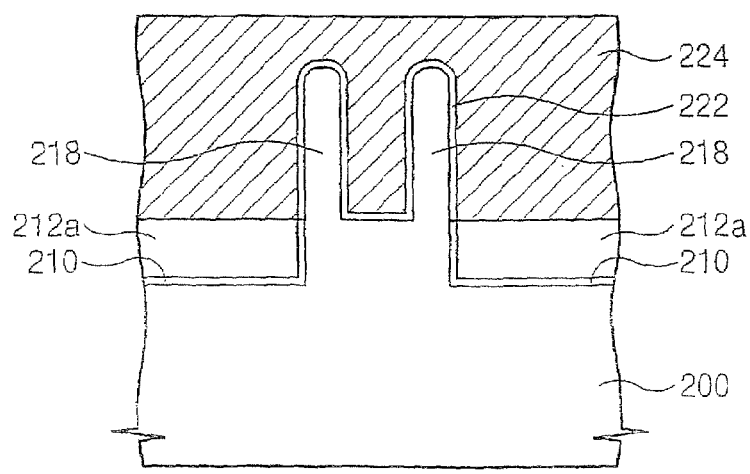

Referring to FIGS. 14A and 14B, the planarized filling insulating layer 212 may be recessed to form a filling insulating pattern 212a surrounding lower portions of external sidewalls of the pair of fins 218 and the connection part 220. A top surface of the filling insulating pattern 212a may have the height close to that of a bottom of the gap region 221.

The first and second bird's beaks 206 and 216, and the sidewall oxide layer 210 may be removed to expose upper portions of the pair of fins 218 and the connection part 220. Forming the filling insulating pattern 212a and removing the first and second bird's beak 206 and 216 and removing the sidewall oxide layer may be performed at the same time.

A tunnel insulating layer 222 may be formed on an exposed surface of the fins 218 and the connection part 220. The tunnel insulating layer 222 may be formed using thermal oxidation. A first gate material layer 224 may be formed on the tunnel insulating layer 222. The first gate material layer 224 may be a doped polysilicon layer. In an alternative, the first gate material layer 224 may be a trap insulating layer having deep level traps, such as, a silicon nitride layer. The first gate insulating layer 212 may fill a gap region 221 between the pair of fins 218. A top surface of the first gate material layer 224 may be in a planarized state.

Figure 15A:
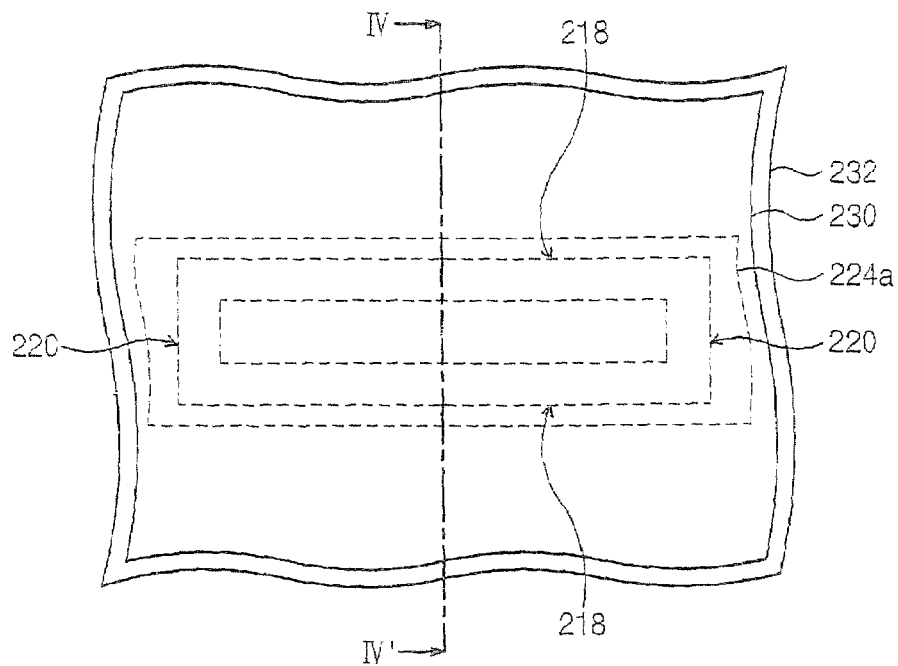
Figure 15B:
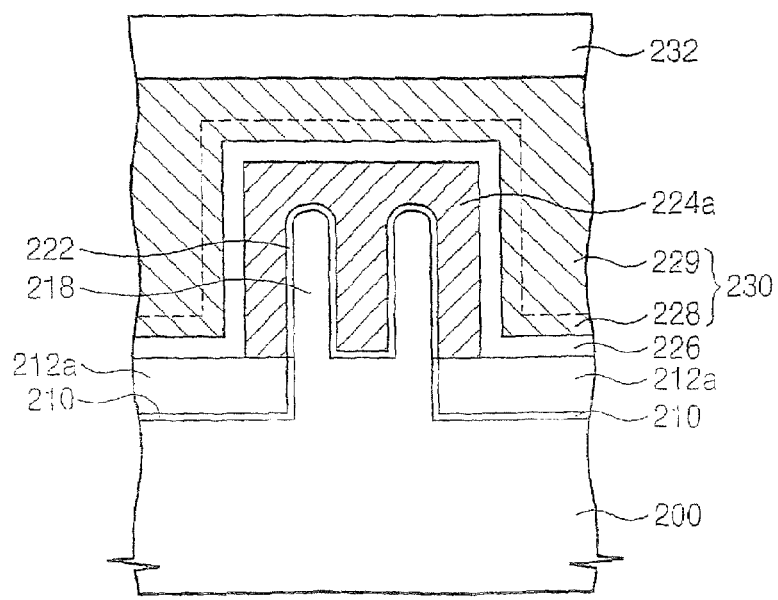

Referring to FIGS. 15A and 15b, the first gate material layer 224 may be patterned to form a preliminary floating gate 224a. The preliminary floating gate 224a is parallel with respect to the fins 218 and covers the pair of the fins 218.

A high-k dielectric layer 226 and a second gate material layer 230 may be sequentially formed on an entire surface of a substrate 200 including the preliminary floating gate 224a. The high-k dielectric layer may be formed of an insulating layer having a dielectric constant higher than that of a silicon nitride layer. The high-k dielectric layer 226 may be formed of a metal oxide. More particularly, the high-k dielectric layer may be formed of one or more of hafnium oxide, aluminum oxide, and/or a lanthanum oxide, and/or a combinations thereof. For example, the high-k dielectric layer may include a first layer of aluminum oxide, and a second layer of at least one hafnium oxide and/or lanthanum oxide.

A lower portion 228 of the second gate material layer 230 may be a conductive metal nitride layer. For example, the lower portion 228 may be formed of a titanium nitride and/or tantalum oxide. Furthermore, the lower portion 228 may include a layer of another conductive nitride material such as a tungsten nitride layer. An upper portion 229 of the second gate material layer 230 may be formed of the same conductive metal nitride material as the lower portion 228. In an alternative, the upper portion 229 may be formed of a metal such as tungsten and/or molybdenum.

A capping layer 232 may be formed on the second gate material layer 230. The capping layer 232 may be formed of an insulating material such as silicon nitride and/or silicon oxide.

The capping layer 232, the second gate material layer 230, the high-k dielectric layer 226 and the preliminary floating gate 224a may be successively patterned to form the floating gate 224b', the high-k dielectric pattern 226a', the control gate electrode 230a" and the capping pattern 232a, as illustrated in FIGS. 8 and 9. Impurity ions may then be implanted using the control gate electrode 230a" and the capping pattern 232a as a mask to form the impurity doped layer 234 illustrated in FIG. 8.

In the method discussed above for forming a non-volatile memory cell, the fins 218 may be defined by recessing the hard mask pattern 202. The fins 218 may thus be formed still narrower than a minimal line width that can be defined by a photolithography process. Accordingly, a relatively high-integration density of non-volatile memory cells can be provided.

Modifications of the non-volatile memory cell will be described hereinafter according to further embodiments of the present invention with reference to the plan view of FIG. 16.

Figure 16:
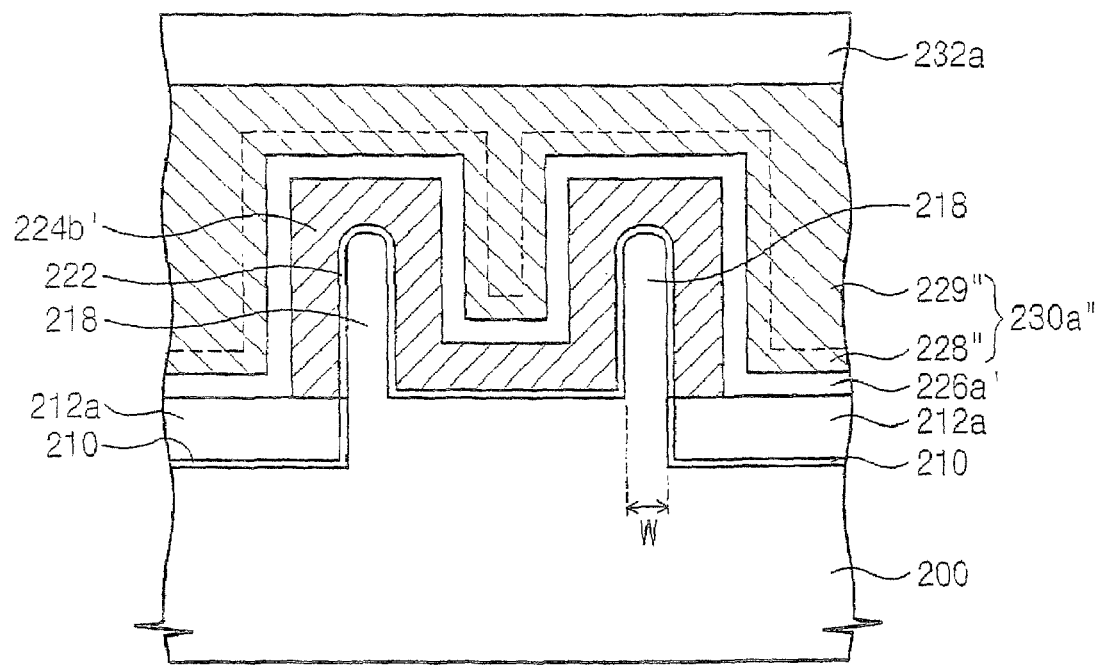
FIG. 16 is a cross-sectional view illustrating a non-volatile memory cell according to other embodiments of the present invention.

Referring to FIG. 16, a control gate electrode 230a" crosses over the pair of fins 218. A floating gate 224b' is provided between the control gate electrode 230a" and the pair of fins 218. The floating gate 224b' is conformally placed along both sidewalls and top surfaces of the pair of fins 218 located under the floating gate 224b', and the bottom of a gap region between the pair of fins 218. That is, the gap region under the control gate electrode 230a" may not be completely filled by the floating gate 224b'. The control gate electrode 230a" may extend downward to fill in the gap region. A high-k dielectric pattern 226a' is provided between the control gate electrode 230a" and the floating gate 224b'. Accordingly, overlapped areas of the control gate electrode 230a" and the floating gate 224b' may be increased, so that a capacitance between the control gate electrode 230a" and the floating gate 224b' may be increased. Accordingly, a coupling ratio of the non-volatile memory cell may be further increased, so that it may be possible to reduce operating voltages.

The non-volatile memory cell shown in FIG. 16 may be provided by conformally forming the first gate material layer 224 of FIGS. 14A and 14B on an entire surface of a substrate 200 including a gap region between the pair of fins 218. That is, the first gate material layer 224 may not completely fill the gap region. To more conformally form the first gate material layer 224, a width of the hard mask patterns of FIGS. 11A and 11B may be increased to increase the width of the gap region.

As discussed above, a floating gate of a non-volatile memory cell may cover an upper surface and both sidewalls of a fin vertically protruding from a substrate. In addition, a high-k dielectric layer may be provided between the floating gate and the control gate electrode. Accordingly, a turn-on current of the non-volatile memory cell may be increased, thereby increasing a sensing margin and reducing an operating voltage. Moreover, a coupling ratio of the non-volatile memory cell may be increased by the high-k dielectric layer, thereby reducing an operating voltage. Accordingly, a non-volatile memory cell with relatively low power consumption may be provided.

Furthermore, a channel region of the non-volatile memory cell may include portions of top surfaces and both sidewalls of a pair of fins. For this reason, a width of the channel region may be further increased, and a turn-on current of the non-volatile memory cell may be further increased. At this time, a turn-on current of the non-volatile memory cell may be increased as a result of the high-k dielectric layer without significantly reducing coupling ratio of the non-volatile memory cell. Instead, the coupling ratio may be increased by the high-k dielectric layer, and it may be possible to further reduce an operating voltage of the non-volatile memory cell.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A non-volatile memory device comprising:
    a semiconductor fin protruding from a semiconductor substrate wherein the semiconductor fin is directly on the semiconductor substrate;
    a tunnel insulating layer on portions of the semiconductor fin;
    a floating gate on the tunnel insulting layer, so that the tunnel insulating layer is between the floating gate and the semiconductor fin;
    a dielectric layer on the floating gate, so that the floating gate is between the dielectric layer and the semiconductor fin;
    a control gate electrode on the dielectric layer, so that the dielectric layer is between the control gate electrode and the floating gate
    an insulating layer on the semiconductor substrate adjacent the semiconductor fin, wherein portions of the semiconductor fin extend beyond the insulating layer, and wherein the insulating layer is between portions of the control gate electrode and the semiconductor substrate; and
    a sidewall oxide layer between the insulating layer and the semiconductor substrate and between the insulating layer and the semiconductor fin.

2. A non-volatile memory device according to claim 1 wherein the dielectric layer comprises a high-K dielectric material having a dielectric constant higher than a dielectric constant of silicon nitride.

3. A non-volatile memory device according to claim 2 wherein the high-K dielectric material includes at least one of hafnium oxide, aluminum oxide, and/or lanthanum oxide.

4. A non-volatile memory device according to claim 1 wherein the dielectric layer includes an aluminum oxide layer and at least one of a hafnium oxide layer and/or a lanthanum oxide layer.

5. A non-volatile memory device according to claim 1 wherein the semiconductor fin has a mesa shape with a mesa surface opposite the semiconductor substrate and mesa sidewalls between the mesa surface and the semiconductor substrate, wherein a transition from the mesa surface to a mesa sidewall has a rounded shape.

6. A non-volatile memory device according to claim 1 wherein the control gate electrode comprises a conductive metal nitride layer in direct contact with the dielectric layer.

7. A non-volatile memory device according to claim 6 wherein the conductive metal nitride comprises at least one of titanium nitride, and/or tantalum nitride.

8. A non-volatile memory device according to claim 6 wherein the control gate electrode comprises a metal layer on the conductive metal nitride layer wherein the conductive metal nitride layer is between the metal layer and the dielectric layer.

9. A non-volatile memory device according to claim 8 wherein the metal layer comprises at least one of a tungsten layer and/or a molybdenum layer.

10. A non-volatile memory device according to claim 1 wherein portions of the semiconductor fin extend beyond opposite sides of the control gate electrode wherein portions of the semiconductor fin extending beyond the control gate electrode are doped.

11. A non-volatile memory device according to claim 1 further comprising:
    a second semiconductor fin protruding from the semiconductor substrate wherein the first and second semiconductor fins are parallel wherein the second semiconductor fin is directly on the semiconductor substrate;
    wherein the tunnel insulating layer is on portions of the first and second semiconductor fins;
    wherein the floating gate is on portions of the first and second semiconductor fins with the tunnel insulating layer between the floating gate and the first and second semiconductor fins;
    wherein the dielectric layer is on the first and second semiconductor fins with the floating gate between the dielectric layer and the first and second semiconductor fins; and
    wherein the control gate electrode crosses the first and second semiconductor fins with the dielectric layer between the control gate electrode and the first and second semiconductor fins.

12. A non-volatile memory device according to claim 11 further comprising:
    first and second connection portions protruding from the semiconductor substrate wherein the first connection portion is connected between the first and second semiconductor fins on a first side of the control gate electrode, wherein the second connection portion is connected between the first and second semiconductor fins on a second side of the control gate electrode.

13. A non-volatile memory device according to claim 11 wherein the first and second semiconductor fins define a gap region therebetween.

14. A non-volatile memory device according to claim 13 further comprising:
    an insulating layer on the semiconductor substrate adjacent portions of the first and second semiconductor tins, wherein portions of the first and second semiconductor tins extend beyond the insulating layer, and wherein the insulating layer is between portions of the control gate electrode and the semiconductor substrate.

15. A non-volatile memory device according to claim 14 wherein the gap region is free of the insulating layer.

16. A non-volatile memory device according to claim 15 wherein a surface of the semiconductor substrate in the gap region is approximately level with a surface of the insulating layer.

17. A non-volatile memory device according to claim 13 wherein portions of the floating gate extend between the first and second semiconductor fins in the gap region.

18. A non-volatile memory device according to claim 17 wherein the floating gate is conformal with respect to sidewalls of the first and second semiconductor fins and portions of the semiconductor substrate between the semiconductor fins.

19. A non-volatile memory device according to claim 11 wherein portions of the first and second semiconductor fins extend beyond opposite sides of the control gate electrode wherein portions of the semiconductor fins extending beyond the control gate electrode are doped.

20. A non-volatile memory device according to claim 1 wherein the semiconductor fin and the semiconductor substrate comprise a same semiconductor material and have a same crystal orientation and wherein the semiconductor material of the semiconductor fin is in direct contact with the semiconductor material of the semiconductor substrate.

* * * * *